(12) United States Patent
Pagaila et al.

(10) Patent No.: US 8,916,452 B2
(45) Date of Patent: Dec. 23, 2014

(54) SEMICONDUCTOR DEVICE AND METHOD OF FORMING WLCSP USING WAFER SECTIONS CONTAINING MULTIPLE DIE

(75) Inventors: Reza A. Pagaila, Singapore (SG); Yaojian Lin, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 945 days.

(21) Appl. No.: 12/612,938

(22) Filed: Nov. 5, 2009

(65) Prior Publication Data

US 2010/0127360 A1 May 27, 2010

Related U.S. Application Data

(60) Provisional application No. 61/117,211, filed on Nov. 23, 2008.

(51) Int. Cl.
| | |
|---|---|
| *H01L 21/301* | (2006.01) |
| *H01L 23/433* | (2006.01) |
| *H01L 23/538* | (2006.01) |
| *H01L 23/498* | (2006.01) |
| *H01L 23/00* | (2006.01) |
| *H01L 25/065* | (2006.01) |
| *H01L 21/56* | (2006.01) |
| *H01L 23/552* | (2006.01) |
| *H01L 21/683* | (2006.01) |
| *H01L 23/31* | (2006.01) |
| *H01L 21/78* | (2006.01) |

(52) U.S. Cl.
CPC ... *H01L 23/3128* (2013.01); *H01L 2924/15311* (2013.01); *H01L 2224/97* (2013.01); *H01L 2224/20* (2013.01); *H01L 2924/01047* (2013.01); *H01L 2224/32145* (2013.01); *H01L 2924/00013* (2013.01); *H01L 23/4334* (2013.01); *H01L 2924/16152* (2013.01); *H01L 23/5389* (2013.01); *H01L 23/49827* (2013.01); *H01L 21/78* (2013.01); *H01L 2924/19105* (2013.01); *H01L 2924/19042* (2013.01);

(Continued)

(58) Field of Classification Search
USPC .......................................... 438/464, 460, 463
See application file for complete search history.

(56) References Cited

U.S. PATENT DOCUMENTS

| | | |
|---|---|---|
| 5,250,843 A | 10/1993 | Eichelberger |
| 5,353,498 A | 10/1994 | Fillion et al. |

(Continued)

*Primary Examiner* — Howard Weiss
*Assistant Examiner* — Tifney Skyles
(74) *Attorney, Agent, or Firm* — Robert D. Aktins; Patent Law Group: Atkins and Associates, P.C.

(57) ABSTRACT

A semiconductor wafer contains semiconductor die separated by saw streets. The semiconductor wafer is singulated through a portion of the saw streets to form wafer sections each having multiple semiconductor die per wafer section attached by uncut saw streets. Each wafer section has at least two semiconductor die. The wafer sections are mounted over a temporary carrier in a grid pattern to reserve an interconnect area between the wafer sections. An encapsulant is deposited over the wafer sections and interconnect area. A conductive pillar can be formed in the encapsulant over the interconnect area. An interconnect structure is formed over the wafer sections and encapsulant in the interconnect area. The wafer sections and interconnect area are singulated to separate the semiconductor die each with a portion of the interconnect area. A heat sink or shielding layer can be formed over the wafer sections.

29 Claims, 18 Drawing Sheets

(52) U.S. Cl.
CPC ........... *H01L 24/96* (2013.01); *H01L 25/0657* (2013.01); *H01L 2225/06527* (2013.01); *H01L 2924/01322* (2013.01); *H01L 21/565* (2013.01); *H01L 2924/14* (2013.01); *H01L 2924/01005* (2013.01); *H01L 2924/1433* (2013.01); *H01L 2924/09701* (2013.01); *H01L 2924/01074* (2013.01); *H01L 2924/12041* (2013.01); *H01L 2224/73265* (2013.01); *H01L 2225/06541* (2013.01); *H01L 2924/01079* (2013.01); *H01L 2924/0103* (2013.01); *H01L 2924/01006* (2013.01); *H01L 21/561* (2013.01); *H01L 2924/01013* (2013.01); *H01L 2924/3025* (2013.01); *H01L 24/19* (2013.01); *H01L 2924/01073* (2013.01); *H01L 2924/01082* (2013.01); *H01L 2924/13091* (2013.01); *H01L 24/48* (2013.01); *H01L 23/49816* (2013.01); *H01L 2224/48091* (2013.01); *H01L 2225/06582* (2013.01); *H01L 23/552* (2013.01); *H01L 24/97* (2013.01); *H01L 2224/04105* (2013.01); *H01L 2924/30105* (2013.01); *H01L 2924/19043* (2013.01); *H01L 21/6835* (2013.01); *H01L 2924/19041* (2013.01); *H01L 2924/01078* (2013.01); *H01L 2224/12105* (2013.01); *H01L 2924/01004* (2013.01); *H01L 2924/01029* (2013.01)
USPC ........................... 438/460; 438/463; 438/464

(56) References Cited

U.S. PATENT DOCUMENTS

| | | | |
|---|---|---|---|
| 5,841,193 A | 11/1998 | Eichelberger | |
| 7,157,353 B2* | 1/2007 | Farnworth et al. | 438/462 |
| 7,339,275 B2* | 3/2008 | Wang et al. | 257/777 |
| 7,619,901 B2 | 11/2009 | Eichelberger et al. | |
| 8,039,360 B2* | 10/2011 | Spare et al. | 438/455 |
| 2004/0178512 A1* | 9/2004 | Moden et al. | 257/784 |
| 2005/0026331 A1* | 2/2005 | Chiu | 438/121 |
| 2009/0071708 A1* | 3/2009 | Miller et al. | 174/350 |
| 2009/0152692 A1 | 6/2009 | Chow et al. | |
| 2010/0078822 A1* | 4/2010 | Bauer et al. | 257/773 |

* cited by examiner

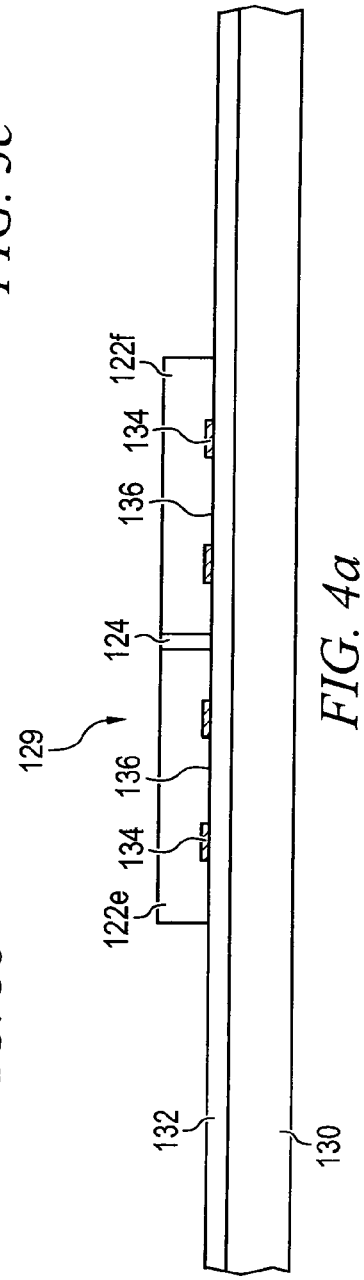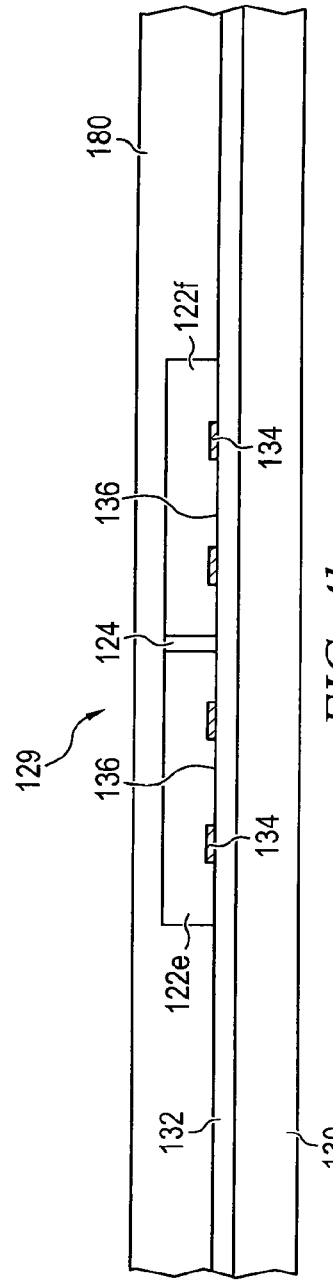

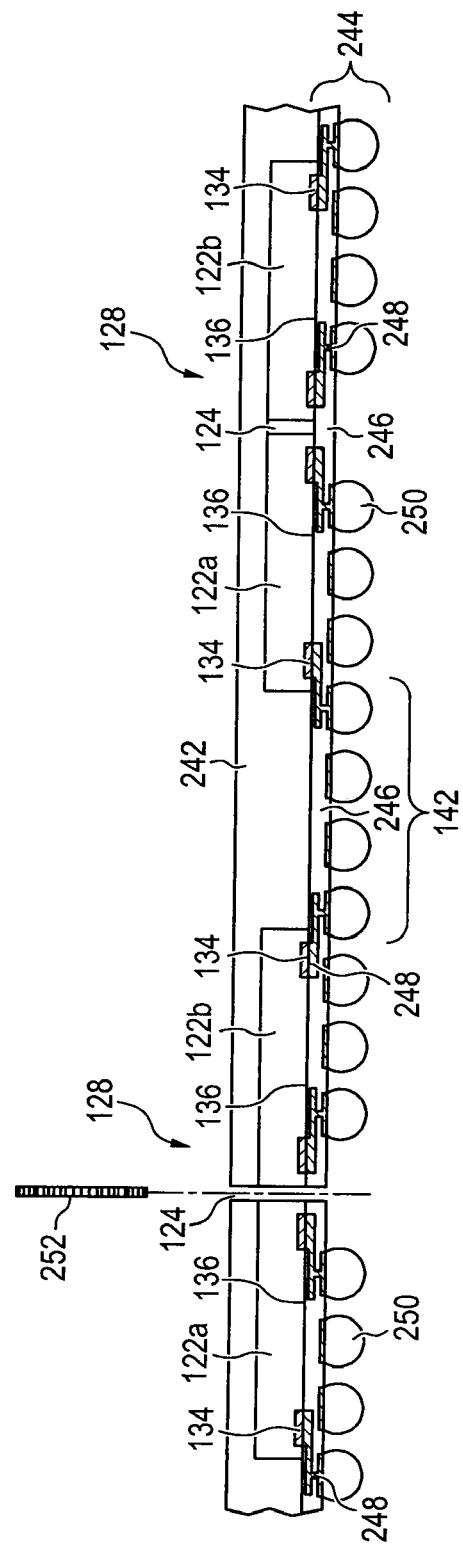
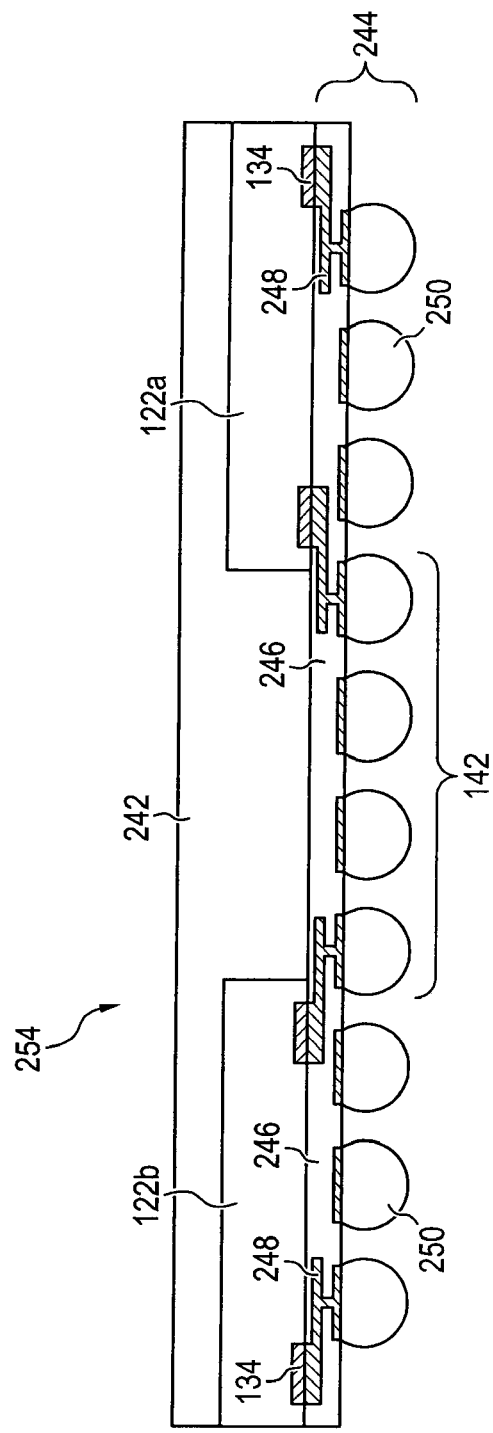

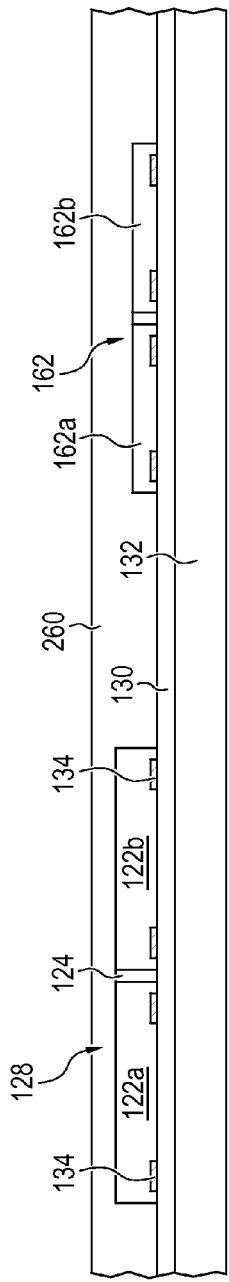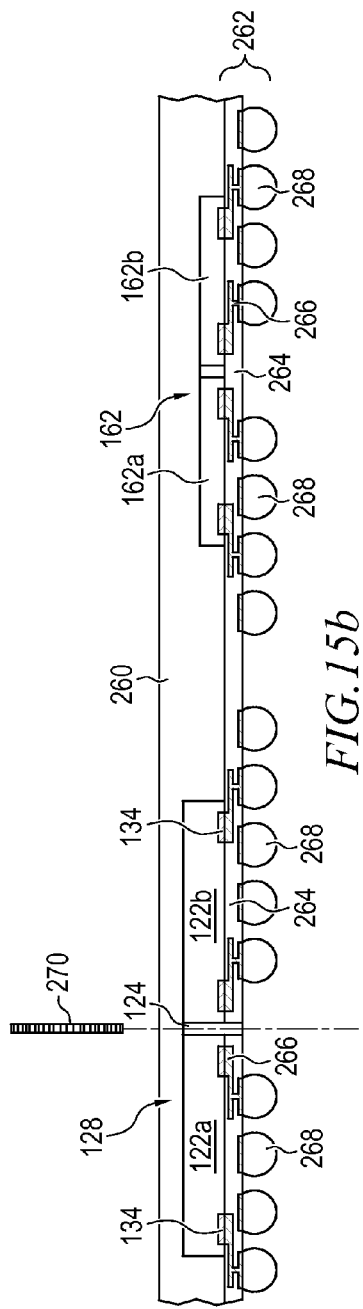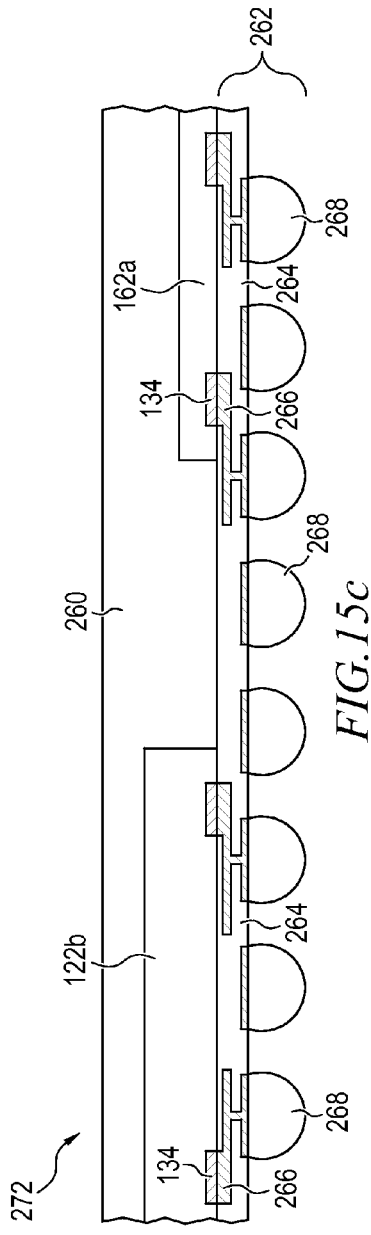

SEMICONDUCTOR DEVICE AND METHOD OF FORMING WLCSP USING WAFER SECTIONS CONTAINING MULTIPLE DIE

CLAIM TO DOMESTIC PRIORITY

The present non-provisional application claims the benefit of priority of U.S. Provisional Application Ser. No. 61/117,211 filed Nov. 23, 2008.

FIELD OF THE INVENTION

The present invention relates in general to semiconductor devices and, more particularly, to a semiconductor device and method of forming a fan out wafer level chip scale package (FO-WLCSP) using wafer sections containing multiple die per section.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In FO-WLCSPs, individual semiconductor die are singulated from a wafer and mounted to a temporary carrier. An encapsulant is deposited over the semiconductor die and carrier. The carrier is removed and a build-up interconnect structure is formed over the die. The wafer singulation process and pick and place operation to align and mount each single semiconductor die to the temporary carrier are time consuming and error prone, particularly for large diameter semiconductor wafers (e.g., 12 in.) containing many die. In addition, as the feature size of semiconductor die continues to decrease, the alignment of the die to marks on the carrier for subsequent build-up interconnect structures becomes increasingly difficult. The smaller die also have less surface area for adhesion to the carrier and are subject to shifting during encapsulation, which can cause device failure.

SUMMARY OF THE INVENTION

A need exists for a FO-WLCSP with greater interconnect capability. Accordingly, in one embodiment, the present invention is a method of making a semiconductor device comprising the steps of providing a semiconductor wafer containing a plurality of semiconductor die separated by a plurality of saw streets, singulating the semiconductor wafer through a portion of the saw streets to form a plurality of wafer sections each having multiple semiconductor die per wafer section attached by uncut saw streets, mounting the wafer sections over a temporary carrier in a grid pattern to reserve an interconnect area between the wafer sections, depositing an encapsulant over the wafer sections and interconnect area, removing the temporary carrier, forming a first interconnect structure over the wafer sections and encapsulant in the interconnect area, and singulating the wafer sections and interconnect area to separate the semiconductor die each with a portion of the interconnect area.

In another embodiment, the present invention is a method of making a semiconductor device comprising the steps of providing a semiconductor wafer containing a plurality of semiconductor die, singulating the semiconductor wafer to form a plurality of wafer sections each having multiple semiconductor die per wafer section, placing the wafer sections in a grid pattern to reserve an interconnect area between the wafer sections, depositing an encapsulant over the wafer sections and interconnect area, forming a first interconnect structure over the wafer sections and encapsulant in the interconnect area, and singulating the wafer sections and interconnect area to separate the semiconductor die each with a portion of the interconnect area.

In another embodiment, the present invention is a method of making a semiconductor device comprising the steps of singulating a semiconductor wafer to form a wafer section having multiple semiconductor die attached by uncut saw streets, depositing an encapsulant over the wafer section, forming a first interconnect structure over the wafer section, and singulating the wafer section to separate the semiconductor die.

In another embodiment, the present invention is a semiconductor device made by a process comprising the steps of providing a semiconductor wafer containing a plurality of semiconductor die, singulating the semiconductor wafer to form a plurality of wafer sections each having multiple semiconductor die per wafer section, placing the wafer sections in a grid pattern to reserve an interconnect area between the wafer sections, depositing an encapsulant over the wafer sections and interconnect area, forming a first interconnect structure over the wafer sections and encapsulant in the interconnect area, and singulating the wafer sections and interconnect area to separate the semiconductor die each with a portion of the interconnect area.

BRIEF DESCRIPTION OF THE DRAWINGS

FIGS. 3a-3c illustrate singulation of a semiconductor wafer into sections containing multiple die per section;

FIGS. 4a-4d illustrate a process of forming a FO-WLCSP using the multi-die wafer sections;

FIGS. 14a-14d illustrate a process of using the multi-die wafer sections to form the FO-WLCSP with side-by-side same size semiconductor die;

FIGS. 15a-15c illustrate a process of using the multi-die wafer sections to form the FO-WLCSP with side-by-side semiconductor die having different sizes.

DETAILED DESCRIPTION OF THE DRAWINGS

Figure 1:
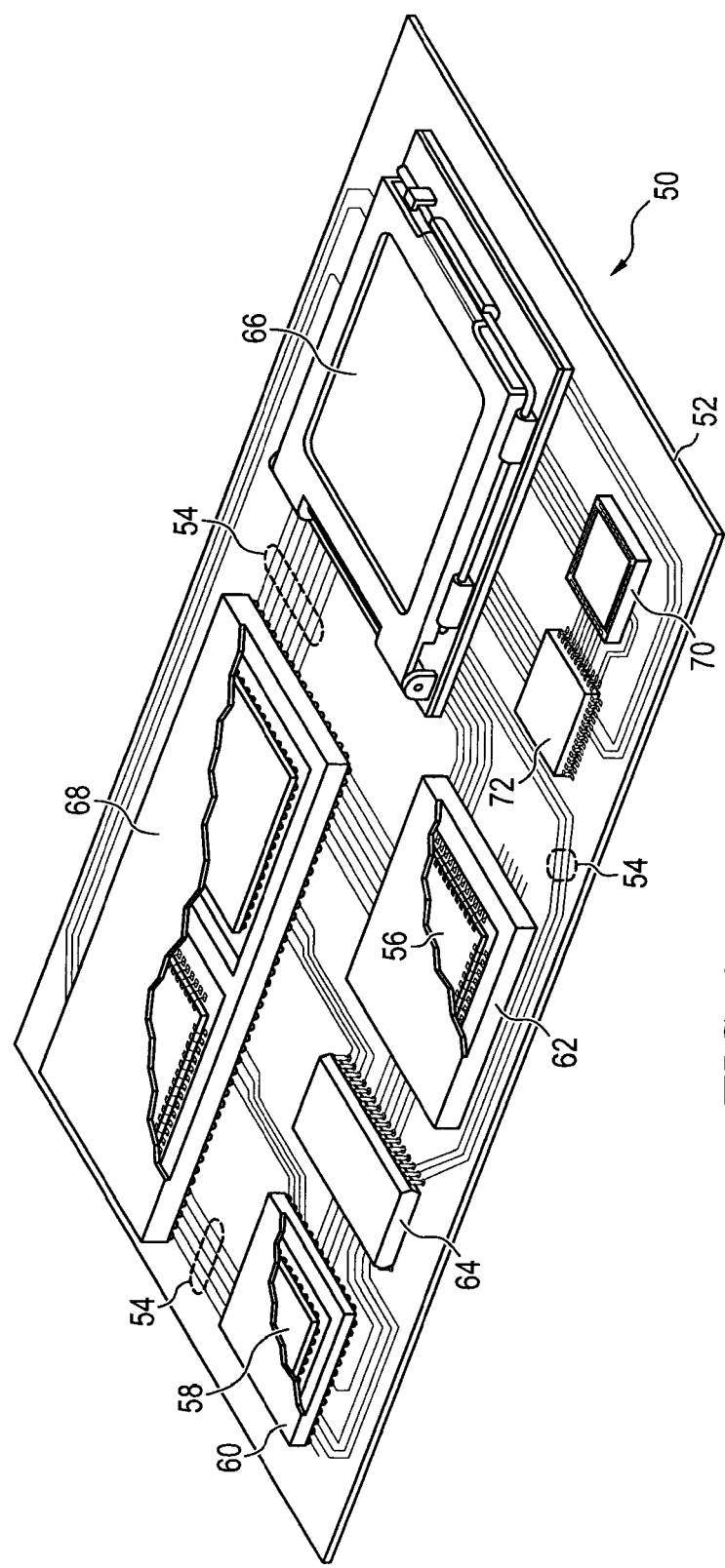
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along nonfunctional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
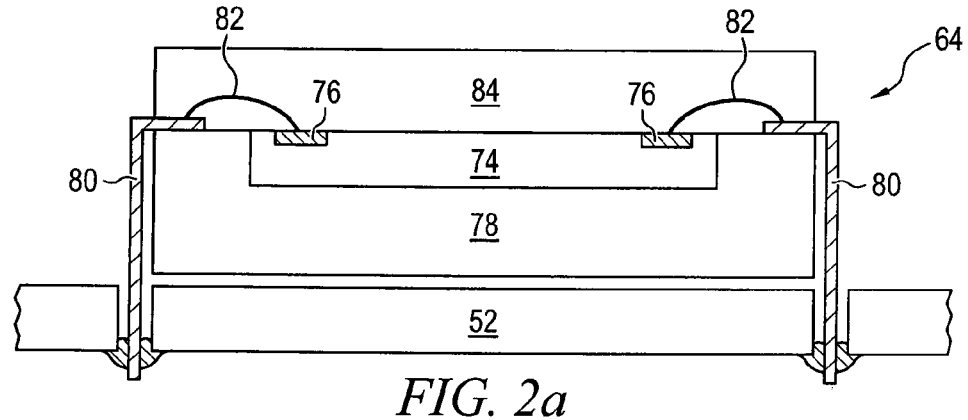
FIGS. 2a-2c illustrate further detail of the representative semiconductor packages mounted to the PCB.
Figure 2B:
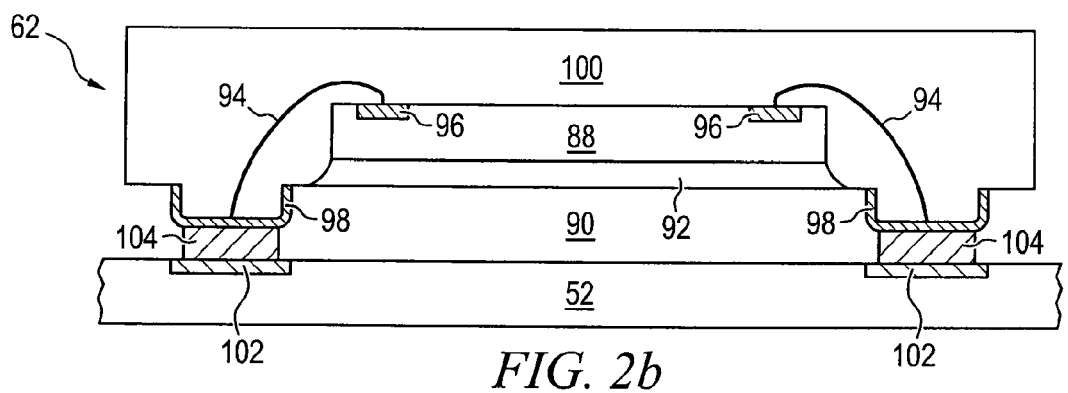
Figure 2C:
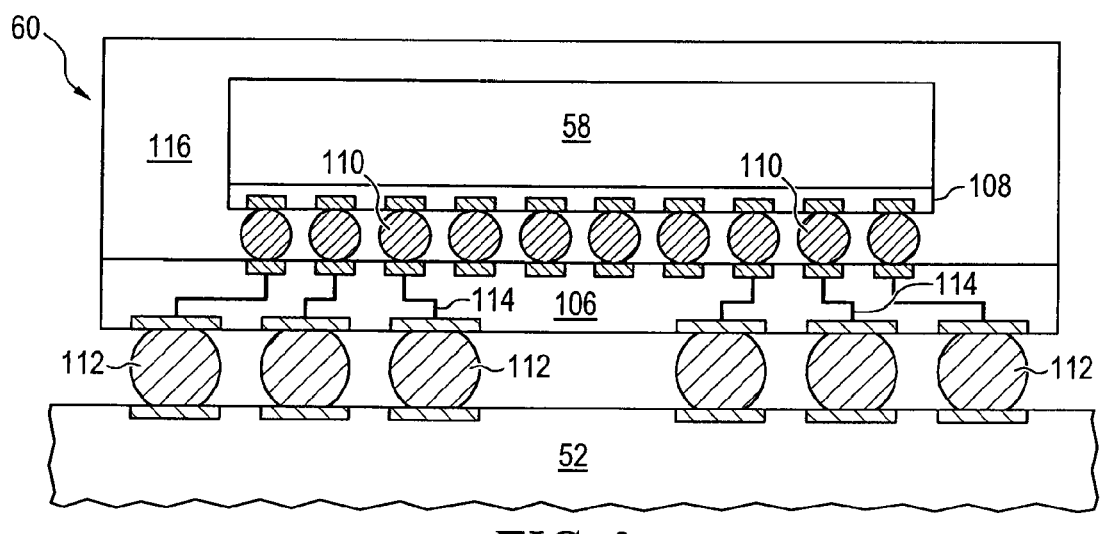
Figure 3A:
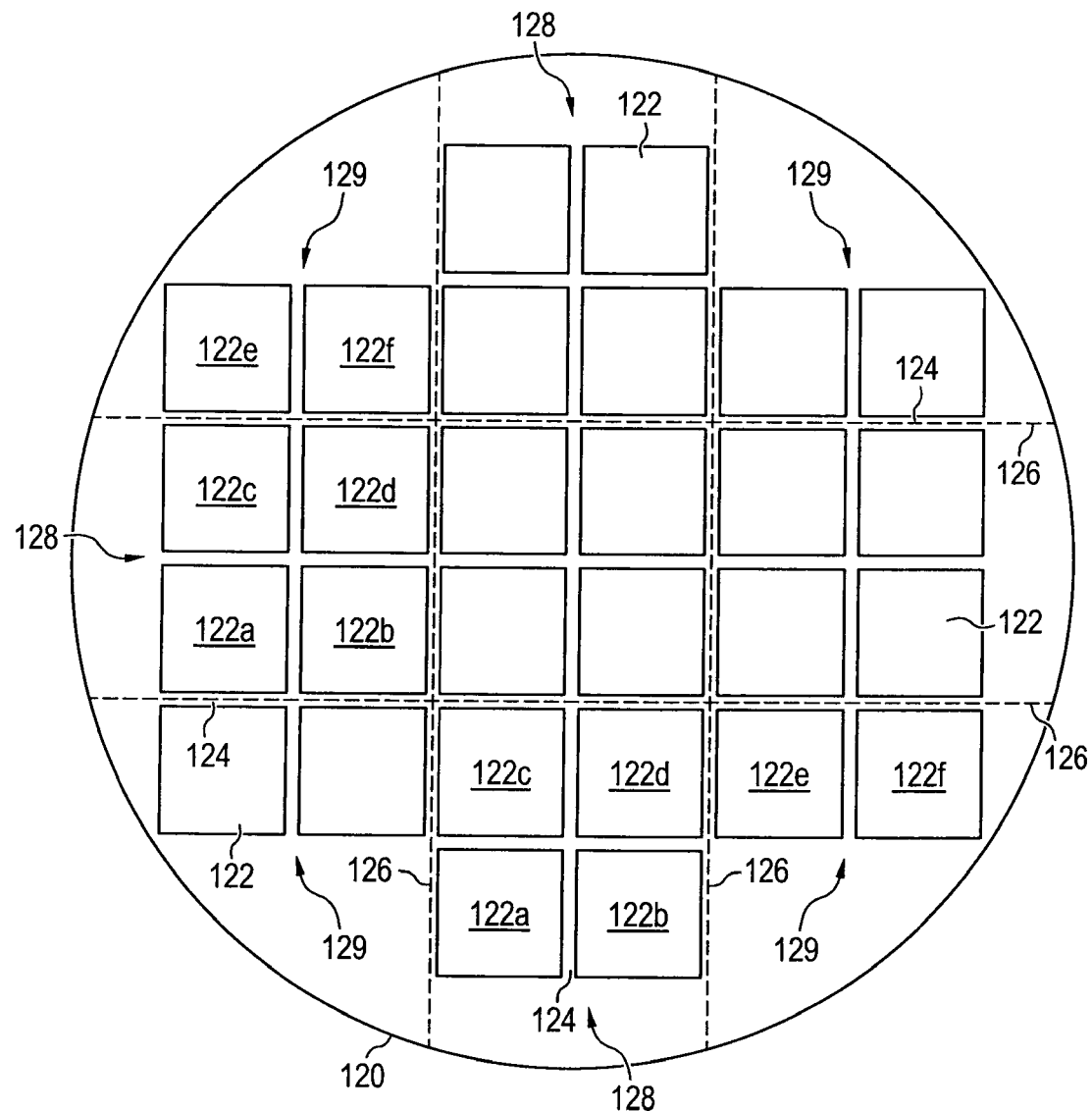

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

FIGS. 3-7 illustrate, in relation to FIGS. 1 and 2a-2c, a process of forming a FO-WLCSP using sections of a semiconductor wafer containing multiple die per section. FIG. 3a shows a semiconductor wafer 120 containing a plurality of semiconductor die 122 formed using the integrated circuit processes described above. Saw streets 124 separate the individual semiconductor die 122. Semiconductor die 122 each include a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband analog circuits or digital circuits, such as digital signal processor (DSP), memory, or other signal processing circuit. Semiconductor die 122 may also contain integrated passive devices (IPDs), such as inductors, capacitors, and resistors, for radio frequency (RF) signal processing.

Semiconductor wafer 120 is singulated with a saw blade or laser cutting device along lines 126 through a portion of saw streets 124 to form a plurality of post-singulation wafer sections or die groups 128 and 129. Not all saw streets 124 are cut. Some saw streets 124 remain intact so that adjacent semiconductor die 122 are still attached. For example, saw streets 124 along lines 126 are cut, while other saw streets 124 remain uncut. Semiconductor die 122a-122d and 122e-122f remain attached by uncut saw streets 124. Accordingly, each post-singulation wafer section or die group 128 has four semiconductor die 122a-122d connected along two edges by uncut saw street 124, as shown in FIG. 3b. Each post-singulation wafer section or die group 129 has two semiconductor die 122e-122f connected along one edge by uncut saw street 124, as shown in FIG. 3c.

In FIG. 4a, a substrate or carrier 130 contains temporary or sacrificial base material such as silicon, polymer, polymer composite, metal, ceramic, glass, glass epoxy, beryllium oxide, or other suitable low-cost, rigid material or bulk semiconductor material for structural support. An optional interface layer 132 can be formed over carrier 130 as a temporary bonding film or etch-stop layer. Semiconductor die group 129, containing two semiconductor die 122e-122f each connected along one edge by uncut saw street 124, is mounted to interface layer 132 on carrier 130 using a pick and place operation with contact pads 134 and active surface 136 oriented face down toward the carrier. Alternatively, semiconductor die group 128, containing four semiconductor die 122a-122d each connected along two edges by uncut saw street 124, can be mounted to interface layer 132 on carrier 130 with contact pads 134 and active surface 136 oriented face down toward the carrier.

Figure 5B:
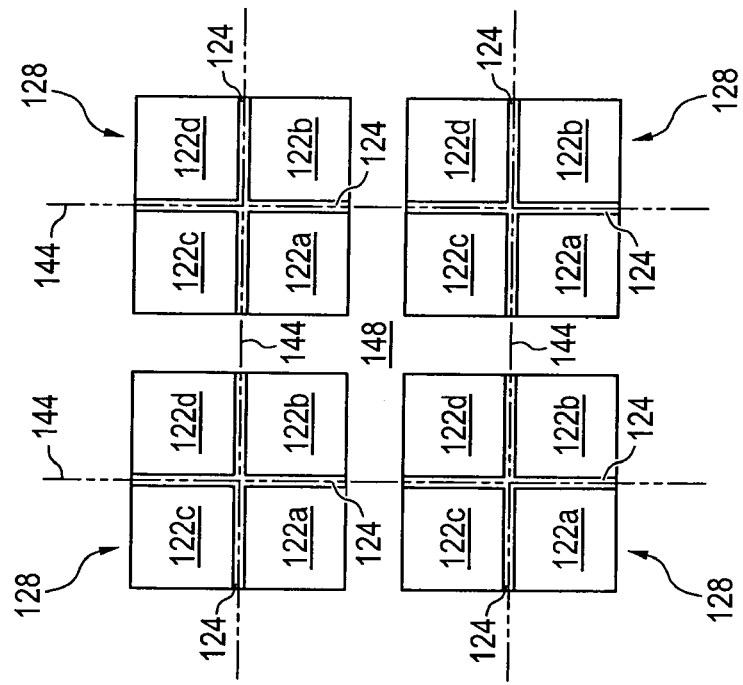
FIGS. 5a-5h illustrate arrangement of the multi-die wafer sections in a grid pattern.
Figure 5A:
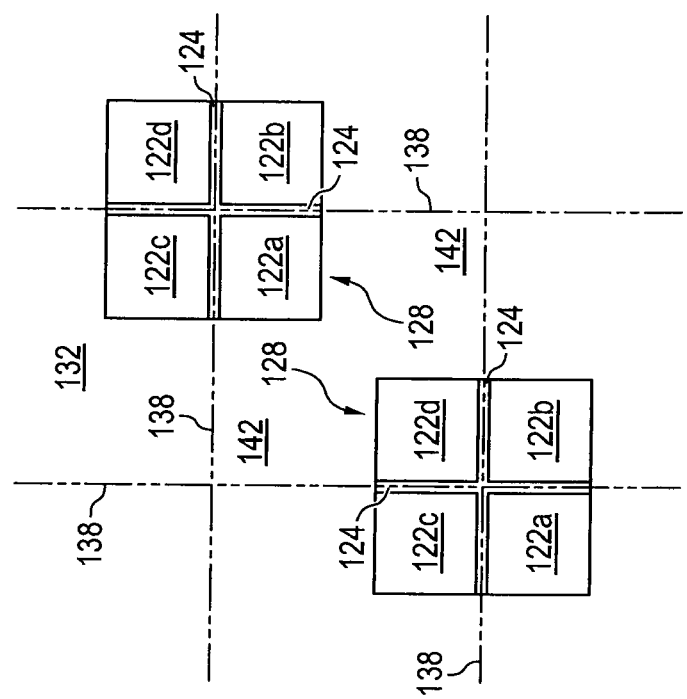
Figure 5D:
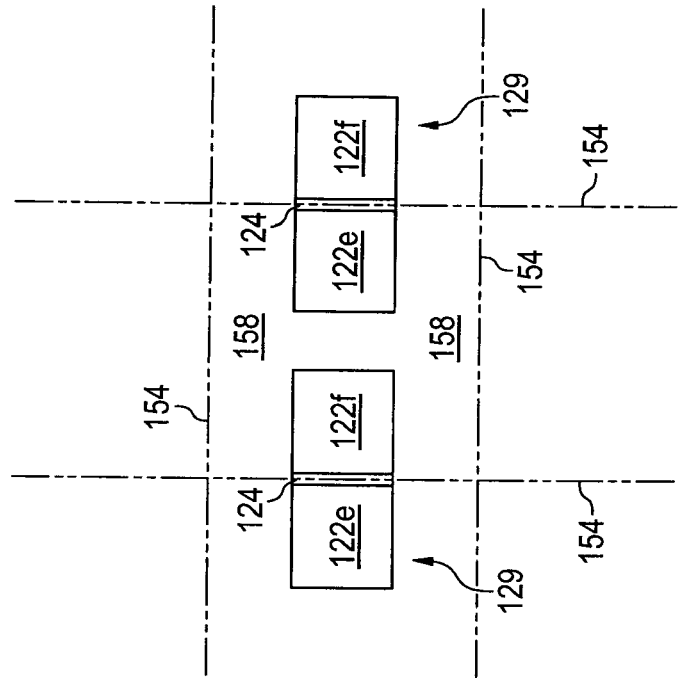
Figure 5C:
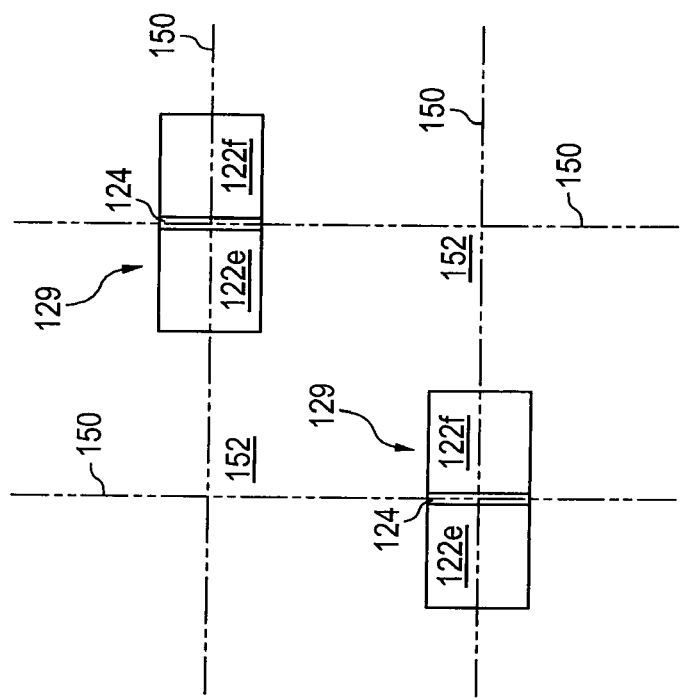
Figure 5F:
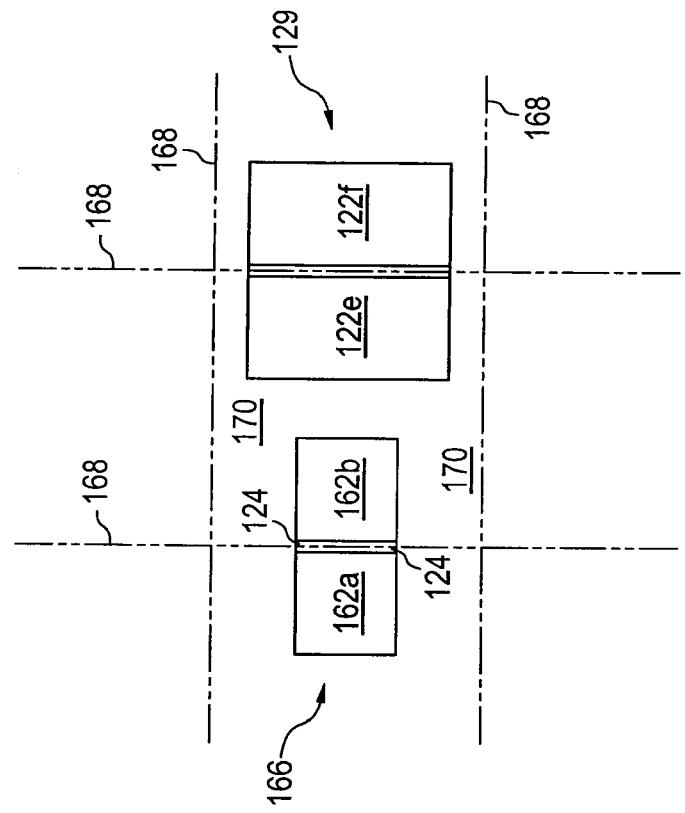
Figure 5E:
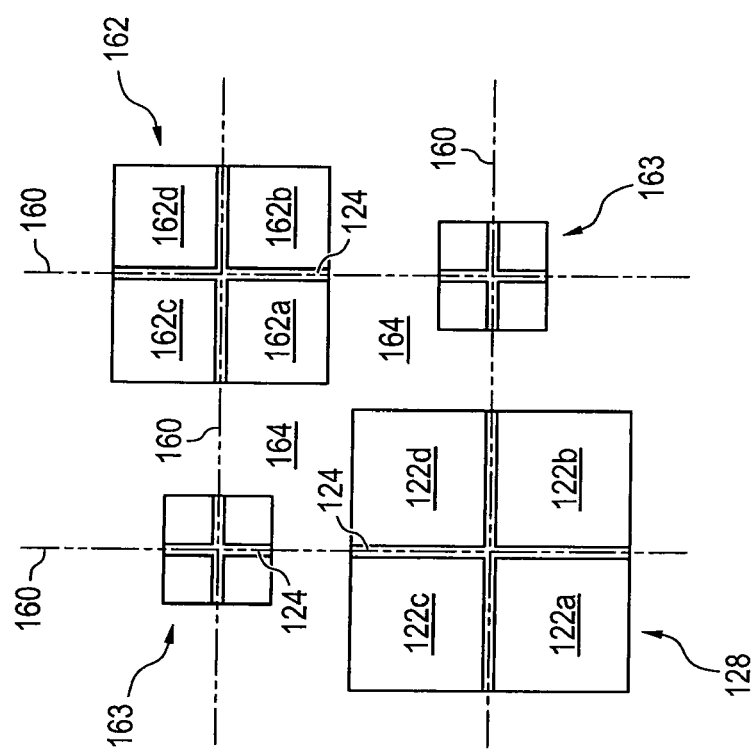
Figure 5H:
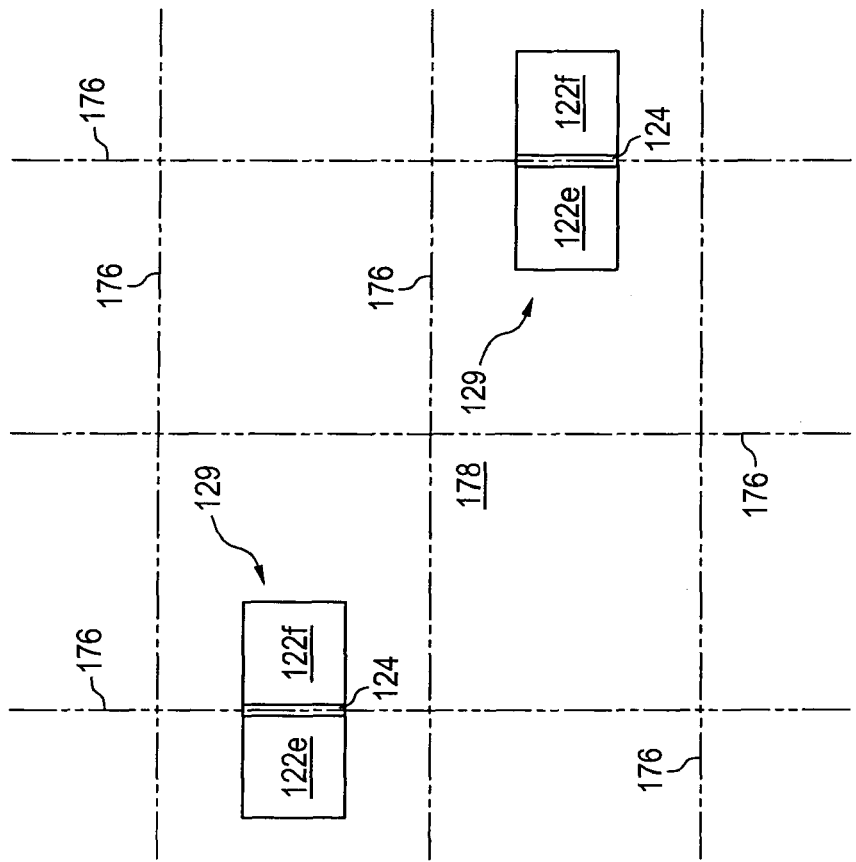
Figure 5G:
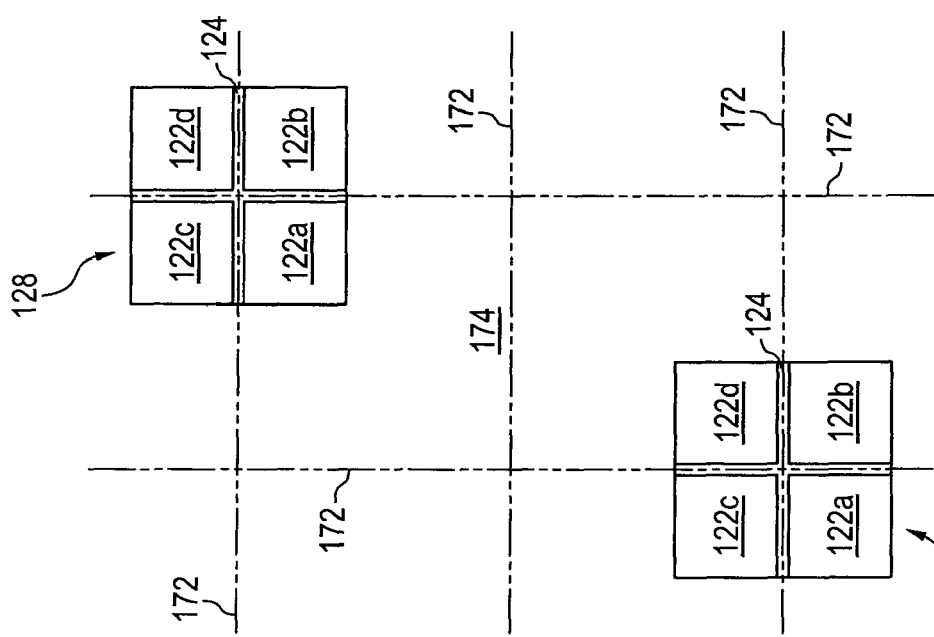

The semiconductor die groups 128 and 129 can be mounted to carrier 130 in a variety of layout patterns or arrangements using a pick and place operation, as shown in FIGS. 5a-5h. FIG. 5a shows two four-die groups 128, each die group containing semiconductor die 122a-122d from wafer 120, mounted on interface layer 132 to carrier 130 in an offset grid pattern defined by lines 138. The offset grid pattern reserves area 142 for later-formed interconnect structures. FIG. 5b shows another grid pattern defined by lines 144 for four-die groups 128, each die group containing semiconductor die 122a-122d from wafer 120, mounted to carrier 130. The grid pattern reserves area 148 for later-formed interconnect structures. FIG. 5c shows the two-die groups 129, each die group containing semiconductor die 122e-122f from wafer 120, mounted to carrier 130 in an offset grid pattern defined by lines 150. The offset grid pattern reserves area 152 for later-formed interconnect structures. FIG. 5d shows another grid pattern defined by lines 154 for two-die groups 129, each die group containing semiconductor die 122e-122f from wafer 120, mounted to carrier 130. The grid pattern reserves area 158 for later-formed interconnect structures. FIG. 5e shows a combination of the four-die groups 128 and different size two-die groups 162 and 163 mounted to carrier 130 in a grid pattern defined by lines 160. The offset grid pattern reserves area 164 for later-formed interconnect structures. FIG. 5f shows a combination of the two-die groups 129 and different size two-die groups 166 mounted to carrier 130 in a grid pattern defined by lines 168. The grid pattern reserves area 170 for later-formed interconnect structures. FIG. 5g shows the four-die groups 128 mounted to carrier 130 in an offset grid pattern defined by lines 172. The offset grid pattern reserves area 174 for later-formed interconnect structures. FIG. 5h shows the two-die groups 129 mounted to carrier 130 in an offset grid pattern defined by lines 176. The grid pattern reserves area 178 for later-formed interconnect structures.

Returning to FIG. 4a, as one example of the possible layout arrangements, the two-die groups 129 are arranged according to FIG. 5h with interconnect area 178 between adjacent two-die groups. FIG. 4b shows a molding compound or other suitable encapsulant 180 deposited over carrier 130 and semiconductor die group 129 using a paste printing, compressive molding, transfer molding, liquid encapsulant molding, vacuum lamination, or other suitable applicator. Encapsulant 180 can be polymer composite material, such as epoxy resin with filler, epoxy acrylate with filler, or polymer with proper filler. Encapsulant 180 is non-conductive and environmentally protects the semiconductor device from external elements and contaminants.

Figure 4C:
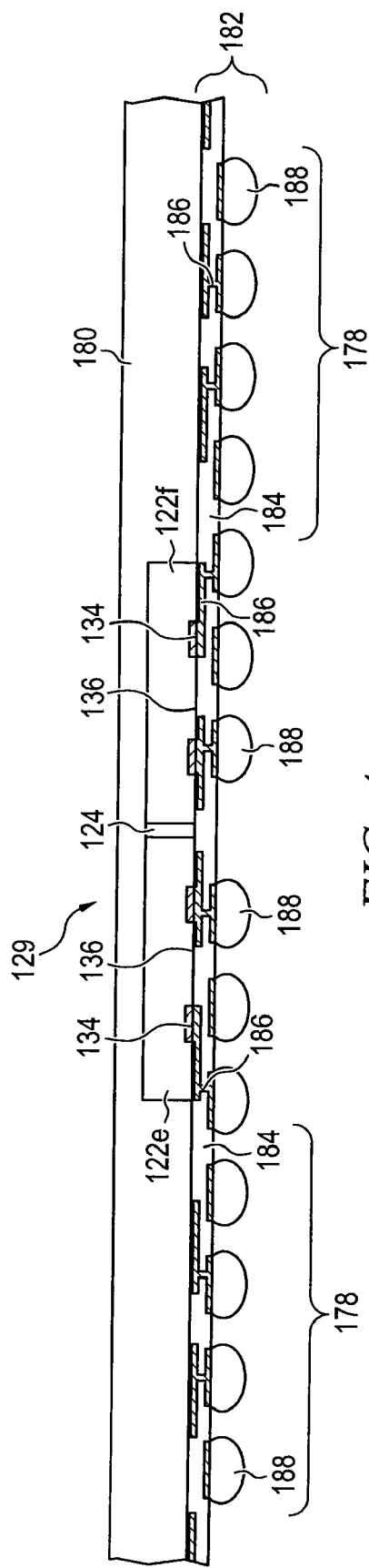

In FIG. 4c, temporary carrier 130 and optional interface layer 132 are removed by chemical etching, mechanical peel-off, CMP, mechanical grinding, thermal bake, laser scanning, or wet stripping. A build-up interconnect structure 182 is formed over semiconductor die group 129 and encapsulant 180 in interconnect area 178. The build-up interconnect structure 182 extends beyond the footprint of semiconductor die 122 into interconnect area 178 around the die.

The build-up interconnect structure 182 includes an insulating or passivation layer 184 containing one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 184 is formed using PVD, CVD, printing, spin coating, spray coating, sintering or thermal oxidation.

The build-up interconnect structure 182 further includes an electrically conductive layer 186 formed in insulating layer 182 using a patterning and metal deposition process such as electrolytic plating and electroless plating. Conductive layer 186 can be one or more layers of Al, Cu, Sn, Ni, Au, Ag, or other suitable electrically conductive material. One portion of conductive layer 186 is electrically connected to contact pads 134 of semiconductor die 122. Other portions of conductive layer 186 can be electrically common or electrically isolated depending on the design and function of the semiconductor device.

An electrically conductive bump material is deposited over build-up interconnect structure 182 and electrically connected to conductive layer 186 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 186 using a suitable attachment or bonding process. In one embodiment, the bump material is reflowed by heating the material above its melting point to form spherical balls or bumps 188. In some applications, bumps 188 are reflowed a second time to improve electrical contact to conductive layer 186. The bumps can also be compression bonded to conductive layer 186. Bumps 188 represent one type of interconnect structure that can be formed over conductive layer 186. The interconnect structure can also use bond wires, stud bump, micro bump, or other electrical interconnect.

Figure 6A:
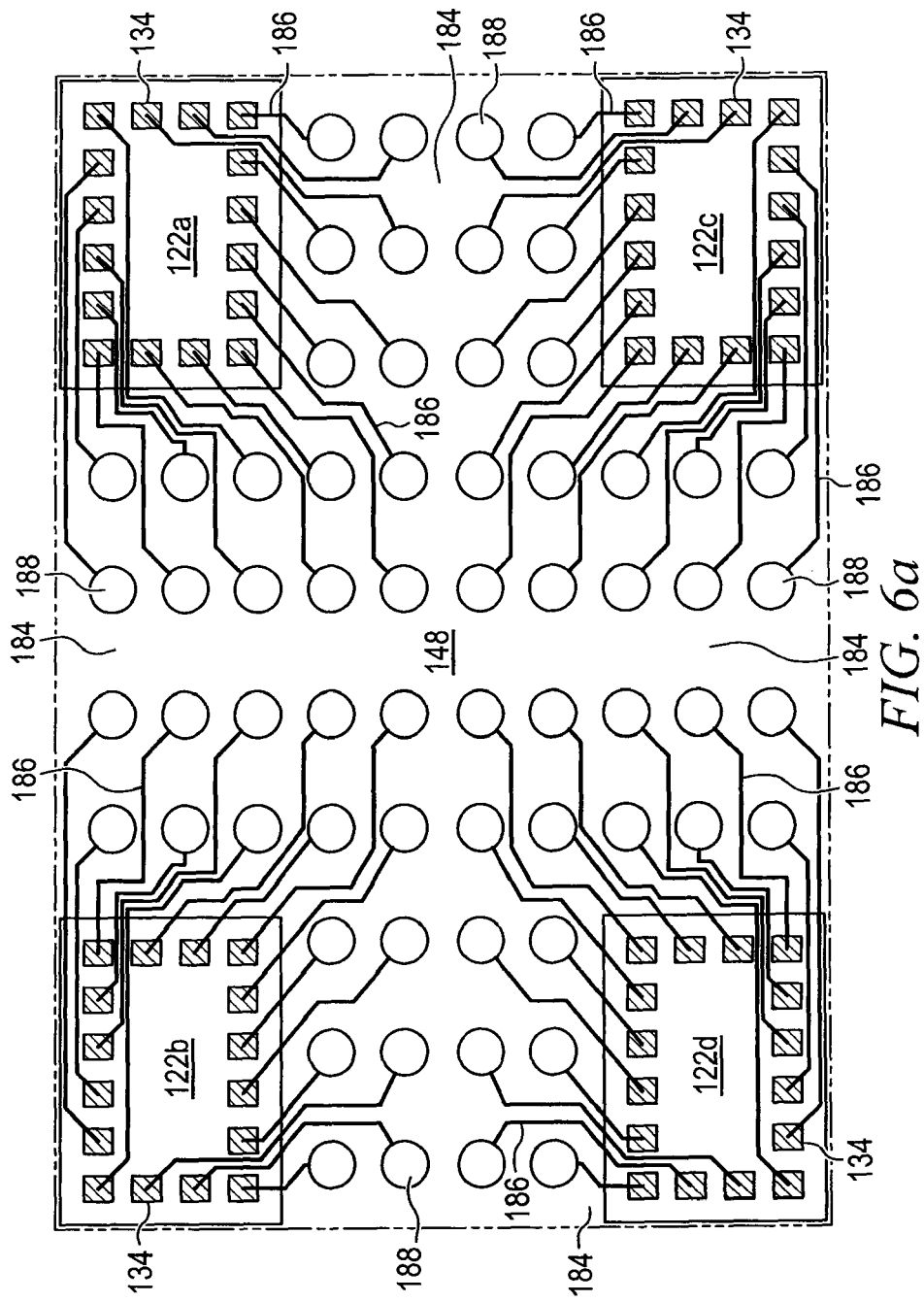
FIGS. 6a-6c illustrate interconnect area between the multi-die wafer sections.
Figure 6B:
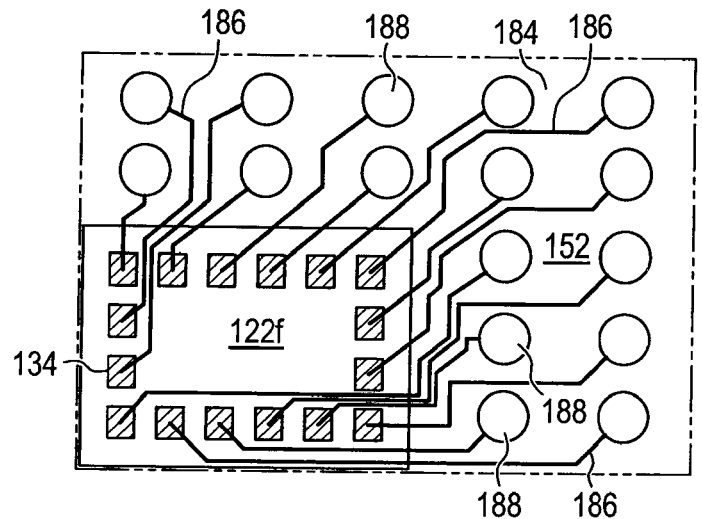
Figure 6C:
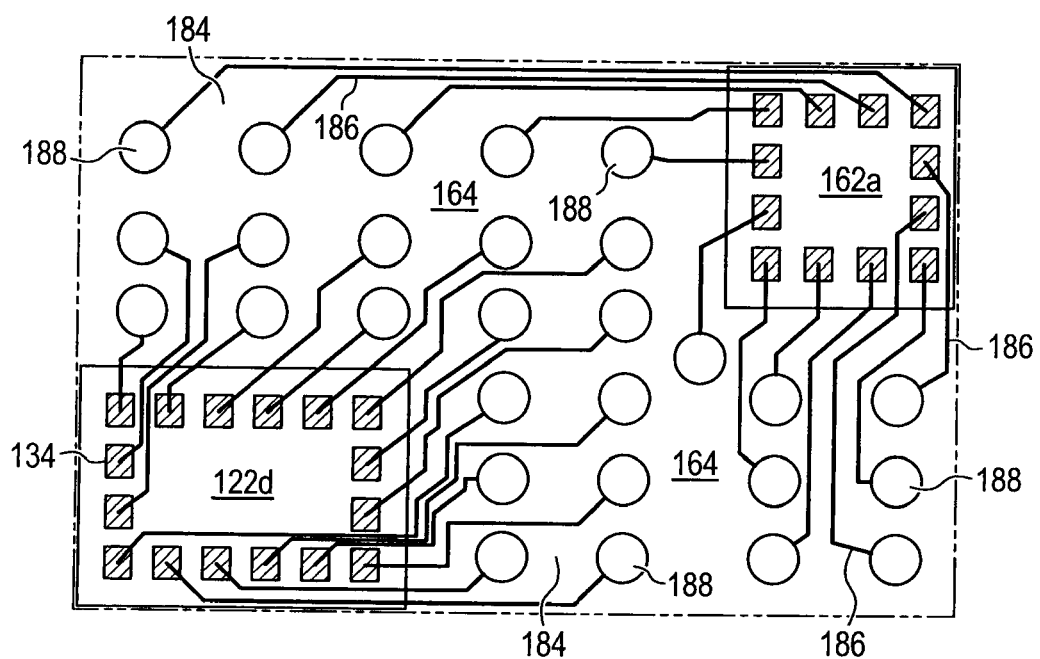

FIG. 6a shows a bottom view of the arrangement of the four-die groups 128 from FIG. 5b with conductive layer 186 and bumps 188 formed over the four-die group and in interconnect area 148. FIG. 6b shows a bottom view of the arrangement of the two-die groups 129 from FIG. 5c with conductive layer 186 and bumps 188 formed over the two-die group and in interconnect area 152. FIG. 6c shows a bottom view of the arrangement of the different size die groups 128 and 162 from FIG. 5e with conductive layer 186 and bumps 188 formed over the four-die group and in interconnect area 164.

Figure 4D:
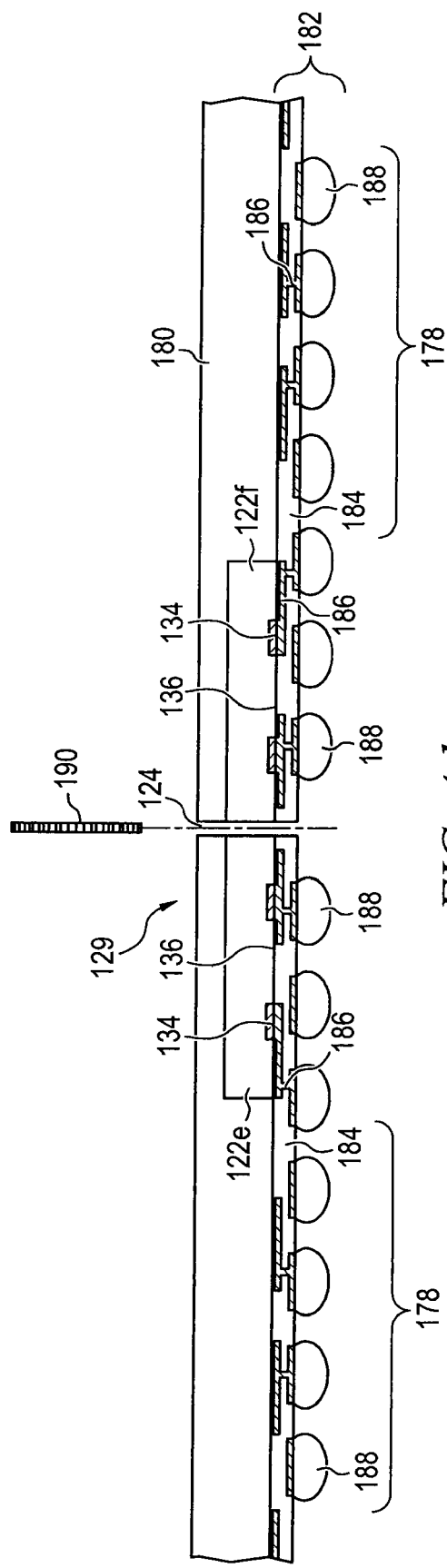

In FIG. 4d, the two-die groups 129 are singulated into individual semiconductor devices with saw blade or laser cutting device 190 through saw street 124 between semiconductor die 122e and 122f and through interconnect area 178. Each semiconductor die 122 retains a portion of interconnect area 178.

Figure 7:
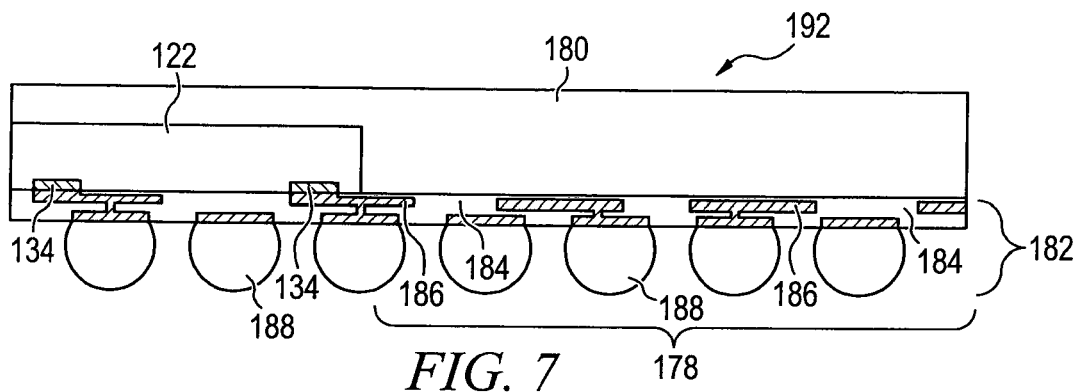
FIG. 7 illustrates the FO-WLCSP with semiconductor die and interconnect area around the die.

FIG. 7 shows FO-WLCSP 192 after singulation. Semiconductor die 122 is electrically connected to build-up interconnect structure 182 and bumps 188 in interconnect area 178. The arrangement of the two-die group 129 on carrier 130 according to FIG. 5h provides an extension of interconnect structure 182 in area 178 for additional interconnectivity. By mounting multiple connected semiconductor die groups to carrier 130 prior to forming build-up interconnect structure 182, the manufacturing process is simplified, saving time and cost during dicing and mounting operations. In addition, the larger multi-die groups have more surface area to form a stronger bond with interface layer 132 to reduce die shifting and associated failures during deposition of encapsulant 180 and formation of the build-up interconnect structure 182. The larger multi-die groups are easier to align with greater die placement accuracy.

Figure 8:
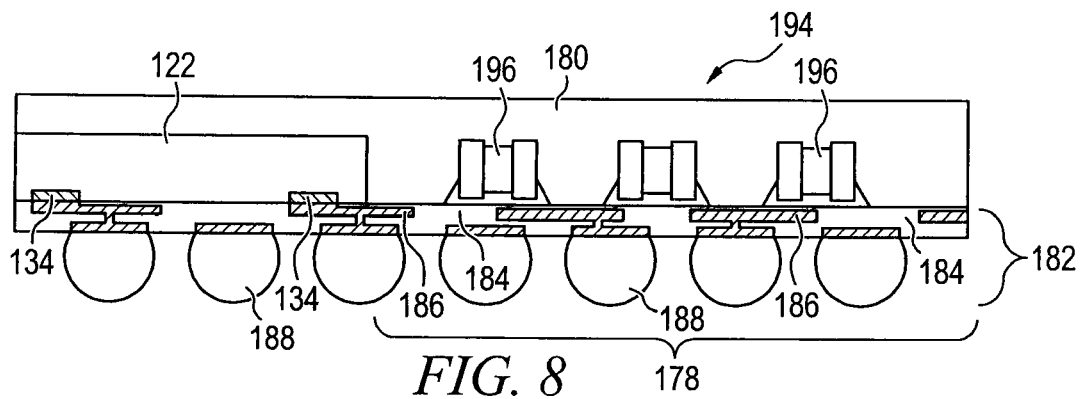
FIG. 8 illustrates discrete semiconductor devices mounted to the interconnect area around the die.

FIGS. 8-13 illustrate alternate embodiments of the FO-WLCSP based on the embodiment described in FIG. 3-7. FIG. 8 shows FO-WLCSP 194 with discrete semiconductor devices 196 mounted in interconnect area 178 prior to depositing encapsulant 180. Discrete components 196 can be resistors, capacitor, inductors, or discrete active devices.

Figure 9:
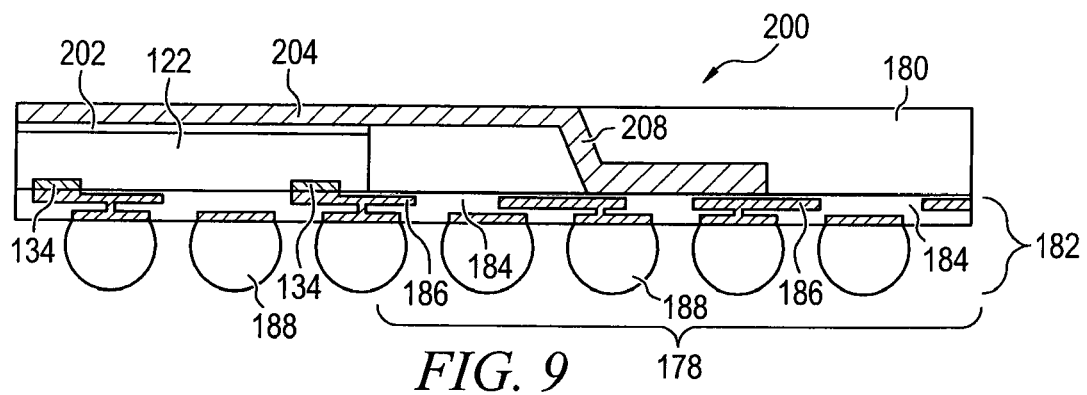
FIG. 9 illustrates a heat sink mounted to the semiconductor die.

FIG. 9 shows FO-WLCSP 200 with a thermal interface material (TIM) 202 is deposited over the back surface of semiconductor die 122, opposite active surface 136. TIM 202 can be aluminum oxide, zinc oxide, boron nitride, or pulverized silver. A heat sink 204 is mounted over TIM 202 and encapsulant 180. Heat sink 204 can be Al, Cu, or another material with high thermal conductivity to provide heat dissipation for semiconductor die 122. TIM 202 aids in the distribution and dissipation of heat generated by semiconductor die 122. Heat sink 204 is connected by stiffener 208 to build-up interconnect structure 182.

Figure 10:
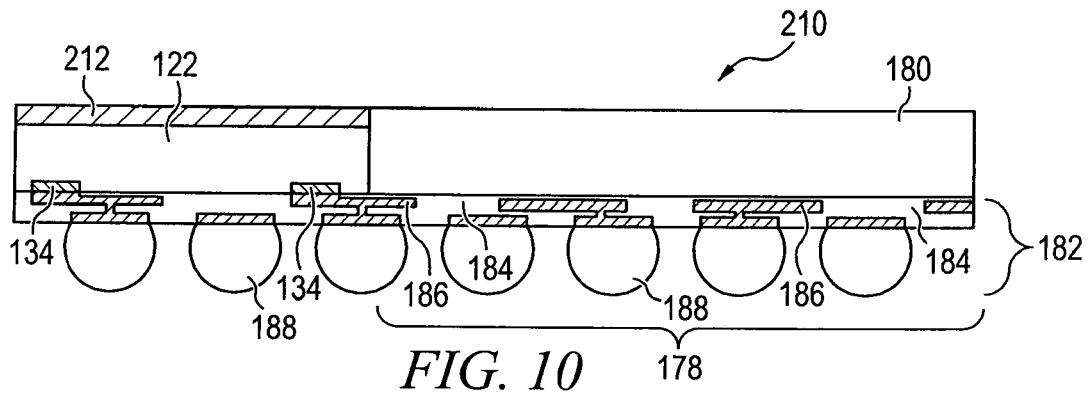
FIG. 10 illustrates a shielding layer mounted to the semiconductor die.

FIG. 10 shows FO-WLCSP 210 with a shielding layer 212 formed over the back surface of semiconductor die 122. Shielding layer 212 is formed prior to singulation while die 122 are in wafer form. Shielding layer 212 can be Cu, Al, ferrite or carbonyl iron, stainless steel, nickel silver, low-carbon steel, silicon-iron steel, foil, epoxy, conductive resin, and other metals and composites capable of blocking or absorbing electromagnetic interference (EMI), radio frequency interference (RFI), and other inter-device interference. Shielding layer 212 can also be a non-metal material such as carbon-black or aluminum flake to reduce the effects of EMI and RFI. Shielding layer 212 is typically grounded through conductive layer 186 to bumps 188.

Figure 11:
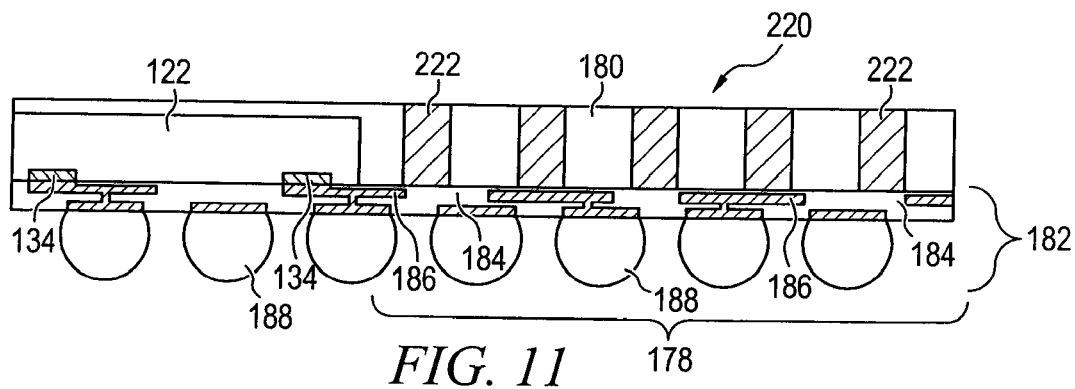
FIG. 11 illustrates conductive pillars formed through the encapsulant.

FIG. 11 shows FO-WLCSP 220 with conductive pillars 222 formed in encapsulant 180 to provide a vertical conductive interconnect through encapsulant for 3D interconnection. A plurality of vias is formed through encapsulant 180 using laser drilling or etching process, such as deep reactive ion etching (DRIE). The vias are filled with Al, Cu, Sn, Ni, Au, Ag, titanium (Ti), W, poly-silicon, or other suitable electrically conductive material using electrolytic plating, electroless plating process, vacuum paste printing, or other suitable metal deposition process to form conductive pillars 222. Conductive pillars 222 provide additional vertical interconnectivity to conductive layer 186. Alternatively, preformed solder balls or stud bumps over interconnect layer 186 can be used as the vertical through encapsulant interconnect.

Figure 12:
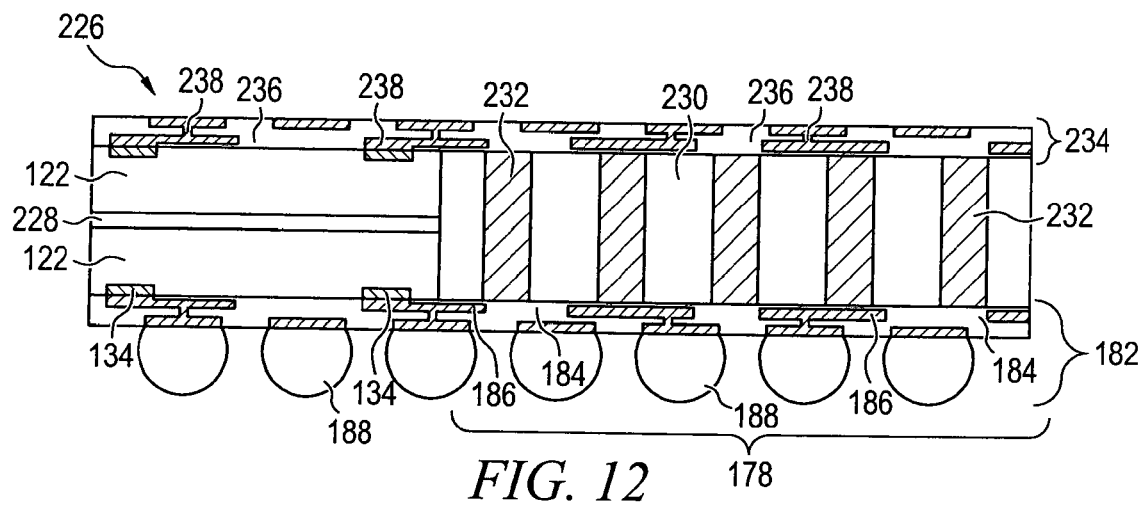
FIG. 12 illustrates two stacked semiconductor die and conductive pillars formed through the encapsulant.

FIG. 12 shows FO-WLCSP 226, similar to the embodiment of FIG. 7, with two stacked semiconductor die 122 joined back-to-back with adhesive layer 228. An encapsulant 230 is deposited over semiconductor die 122 and the interconnect area around the die. A plurality of vias is formed through encapsulant 230 using laser drilling or etching process, such as DRIE. The vias are filled with Al, Cu, Sn, Ni, Au, Ag, Ti, W, poly-silicon, or other suitable electrically conductive material using electrolytic plating, electroless plating process, or other suitable metal deposition process to form conductive pillars 232. A build-up interconnect structure 234 is formed over semiconductor die 122 and encapsulant 230, opposite interconnect structure 182. The build-up interconnect structure 234 extends beyond the footprint of semiconductor die 122 into the interconnect area around the die. The build-up interconnect structure 234 includes an insulating or passivation layer 236 containing one or more layers of $SiO_2$, $Si_3N_4$, SiON, $Ta_2O_5$, $Al_2O_3$, or other material having similar insulating and structural properties. The insulating layer 236 is formed using PVD, CVD, printing, spin coating, spray coating, sintering or thermal oxidation. The build-up interconnect structure 234 further includes an electrically conductive layer 238 formed in insulating layer 236 using a patterning and metal deposition process such as electrolytic plating and electroless plating. Conductive layer 238 can be one or more layers of Al, Cu, Sn, Ni, Au, Ag, or other suitable electrically conductive material. One portion of conductive layer 238 is electrically connected to conductive pillars 232. Other portions of conductive layer 238 can be electrically common or electrically isolated depending on the design and function of the semiconductor device. Conductive pillars 232 provide additional vertical interconnectivity between conductive layers 186 and 238.

Figure 13:
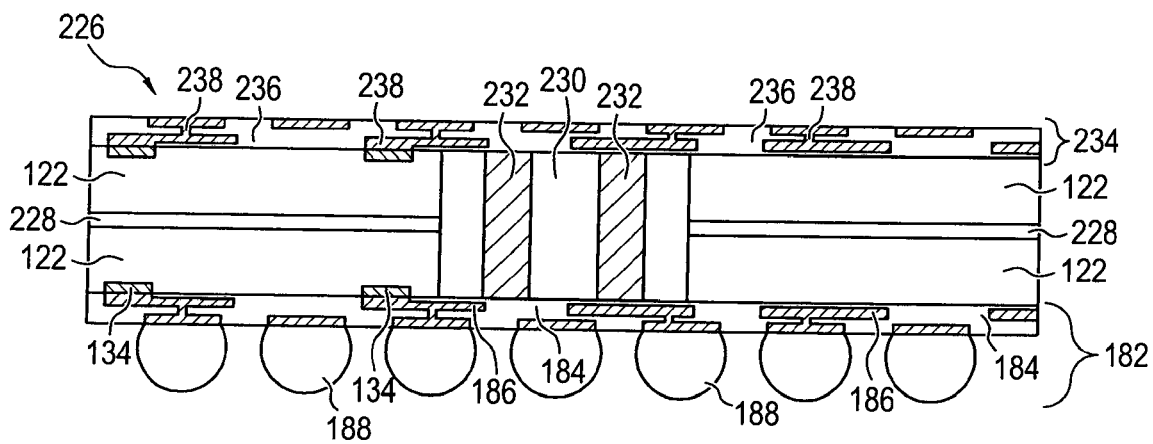
FIG. 13 illustrates two side-by-side stacked semiconductor die and conductive pillars formed through the encapsulant.

FIG. 13 shows FO-WLCSP 240, similar to the embodiment of FIG. 13, with side-by-side stacked semiconductor die 122 joined back-to-back with adhesive layer 228. An encapsulant 230 is deposited over semiconductor die 122 and the interconnect area around the die. Conductive pillars 232 provide interconnectivity between conductive layers 186 and 238.

Figure 14A:
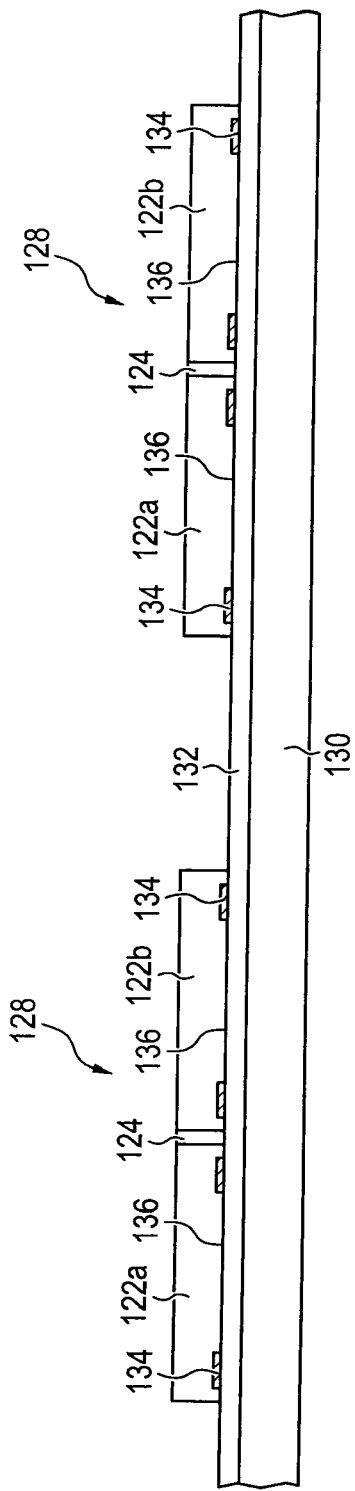

FIGS. 14a-14d illustrate another process of forming the FO-WLCSP using sections of semiconductor wafer 120 containing multiple die per section. Continuing with the structure described in FIGS. 3a-3b, semiconductor die 122 are singulated with a saw blade or laser cutting device along lines 126 through saw streets 124 into four-die groups containing semiconductor die 122a-122d. FIG. 14a shows the four-die groups 128 mounted to carrier 130 using a pick and place operation in the arrangement shown in FIG. 5a.

Figure 14B:
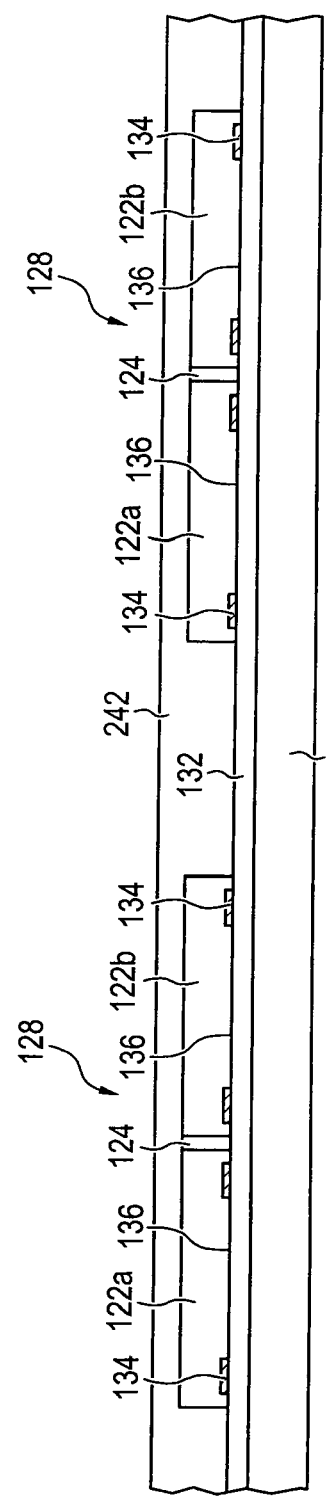

In FIG. 14b, a molding compound or other suitable encapsulant 242 is deposited over carrier 130 and semiconductor die group 128 using a paste printing, compressive molding, transfer molding, liquid encapsulant molding, vacuum lamination, or other suitable applicator. Encapsulant 242 can be polymer composite material, such as epoxy resin with filler, epoxy acrylate with filler, or polymer with proper filler. Encapsulant 242 is non-conductive and environmentally protects the semiconductor device from external elements and contaminants.

In FIG. 14c, temporary carrier 130 and optional interface layer 132 are removed by chemical etching, mechanical peel-off, CMP, mechanical grinding, thermal bake, laser scanning, or wet stripping. A build-up interconnect structure 244 is formed over semiconductor die group 128 and encapsulant 242. The build-up interconnect structure 244 extends beyond the footprint of semiconductor die 122 into interconnect area 142 from FIG. 5a. The build-up interconnect structure 244 includes an insulating or passivation layer 246 containing one or more layers of SiO2, Si3N4, SiON, Ta2O5, Al2O3, or other material having similar insulating and structural properties. The insulating layer 246 is formed using PVD, CVD, printing, spin coating, spray coating, sintering or thermal oxidation. The build-up interconnect structure 244 further includes an electrically conductive layer 248 formed in insulating layer 246 using a patterning and metal deposition process such as electrolytic plating and electroless plating. Conductive layer 248 can be one or more layers of Al, Cu, Sn, Ni, Au, Ag, or other suitable electrically conductive material. One portion of conductive layer 248 is electrically connected to contact pads 134 of semiconductor die 122. Other portions of conductive layer 248 can be electrically common or electrically isolated depending on the design and function of the semiconductor device.

An electrically conductive bump material is deposited over build-up interconnect structure 244 and electrically connected to conductive layer 248 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 248 using a suitable attachment or bonding process. In one embodiment, the bump material is reflowed by heating the material above its melting point to form spherical balls or bumps 250. In some applications, bumps 250 are reflowed a second time to improve electrical contact to conductive layer 248. The bumps can also be compression bonded to conductive layer 248. Bumps 250 represent one type of interconnect structure that can be formed over conductive layer 248. The interconnect structure can also use bond wires, stud bump, micro bump, or other electrical interconnect.

The four-die groups 128 are singulated into individual semiconductor devices with saw blade or laser cutting device 252 through saw street 124 between semiconductor die 122a and 122b and through interconnect area 142. Each semiconductor die 122 retains a portion of interconnect area 142.

FIG. 14d shows FO-WLCSP 254 after singulation. Semiconductor die 122a-122b is electrically connected to build-up interconnect structure 244 and bumps 250 in interconnect area 142. The arrangement of the four-die group 128 on carrier 130 according to FIG. 5a provides an extension of interconnect structure 244 in area 142 for additional interconnectivity. By mounting multiple connected semiconductor die groups to carrier 130 prior to forming build-up interconnect structure 244, the manufacturing process is simplified, saving time and cost during dicing and mounting operations. In addition, the larger multi-die groups have more surface area to form a stronger bond with interface layer 132 to reduce die shifting and associated failures during deposition of encapsulant 242 and formation of the build-up interconnect structure 244. The larger multi-die groups are easier to align with greater die placement accuracy.

FIGS. 15a-15c illustrate another process of forming the FO-WLCSP using sections of semiconductor wafer 120 containing multiple die per section. Continuing with the structure described in FIGS. 3a-3b, semiconductor die 122 are singulated with a saw blade or laser cutting device along lines 126 through saw streets 124 into four-die groups containing semiconductor die 122a-122d. Four-die groups 162 having different size die are singulated from a different semiconductor wafer. FIG. 15a shows the four-die groups 128 and four-die groups 162 mounted to carrier 130 in the arrangement shown in FIG. 5e.

A molding compound or other suitable encapsulant 260 is deposited over carrier 130 and semiconductor die groups 128 and 162 using a paste printing, compressive molding, transfer molding, liquid encapsulant molding, vacuum lamination, or other suitable applicator. Encapsulant 260 can be polymer composite material, such as epoxy resin with filler, epoxy acrylate with filler, or polymer with proper filler. Encapsulant 260 is non-conductive and environmentally protects the semiconductor device from external elements and contaminants.

In FIG. 15b, temporary carrier 130 and optional interface layer 132 are removed by chemical etching, mechanical peel-off, CMP, mechanical grinding, thermal bake, laser scanning, or wet stripping. A build-up interconnect structure 262 is formed over semiconductor die groups 128 and 162 and encapsulant 260. The build-up interconnect structure 262 extends beyond the footprint of semiconductor die 122 into interconnect area 164 from FIG. 5e. The build-up interconnect structure 262 includes an insulating or passivation layer 264 containing one or more layers of SiO2, Si3N4, SiON, Ta2O5, Al2O3, or other material having similar insulating and structural properties. The insulating layer 264 is formed using PVD, CVD, printing, spin coating, spray coating, sintering or thermal oxidation. The build-up interconnect structure 262 further includes an electrically conductive layer 266 formed in insulating layer 264 using a patterning and metal deposition process such as electrolytic plating and electroless plating. Conductive layer 266 can be one or more layers of Al, Cu, Sn, Ni, Au, Ag, or other suitable electrically conductive material. One portion of conductive layer 266 is electrically connected to contact pads 134 of semiconductor die 122. Other portions of conductive layer 266 can be electrically common or electrically isolated depending on the design and function of the semiconductor device.

An electrically conductive bump material is deposited over build-up interconnect structure 262 and electrically connected to conductive layer 266 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 266 using a suitable attachment or bonding process. In one embodiment, the bump material is reflowed by heating the material above its melting point to form spherical balls or bumps 268. In some applications, bumps 268 are reflowed a second time to improve electrical contact to conductive layer 266. The bumps can also be compression bonded to conductive layer 266. Bumps 268 represent one type of interconnect structure that can be formed over conductive layer 266. The interconnect structure can also use bond wires, stud bump, micro bump, or other electrical interconnect.

The four-die groups 128 and 162 are singulated through the saw streets into individual semiconductor devices with saw blade or laser cutting device 270. Each semiconductor die 122 and 162 retains a portion of interconnect area 164.

FIG. 15c shows FO-WLCSP 272 after singulation. Semiconductor die 122b and 162a are electrically connected to build-up interconnect structure 262 and bumps 268 in interconnect area 164. The arrangement of the four-die groups 128 and 162 on carrier 130 according to FIG. 5e provides an extension of interconnect structure 262 in area 164 for additional interconnectivity. By mounting multiple connected semiconductor die groups to carrier 130 prior to forming build-up interconnect structure 262, the manufacturing process is simplified, saving time and cost during dicing and mounting operations. In addition, the larger multi-die groups have more surface area to form a stronger bond with interface layer 132 to reduce die shifting and associated failures during deposition of encapsulant 260 and formation of the build-up interconnect structure 262. The larger multi-die groups are easier to align with greater die placement accuracy.

Figure 16A:
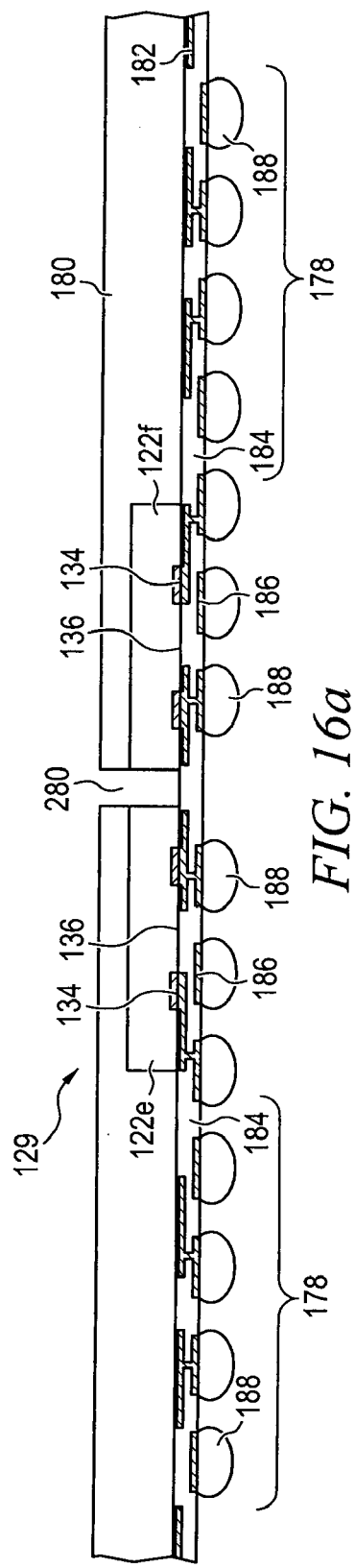
FIGS. 16a-16d illustrate a process of forming a protective layer on a side of the semiconductor die.
Figure 16B:
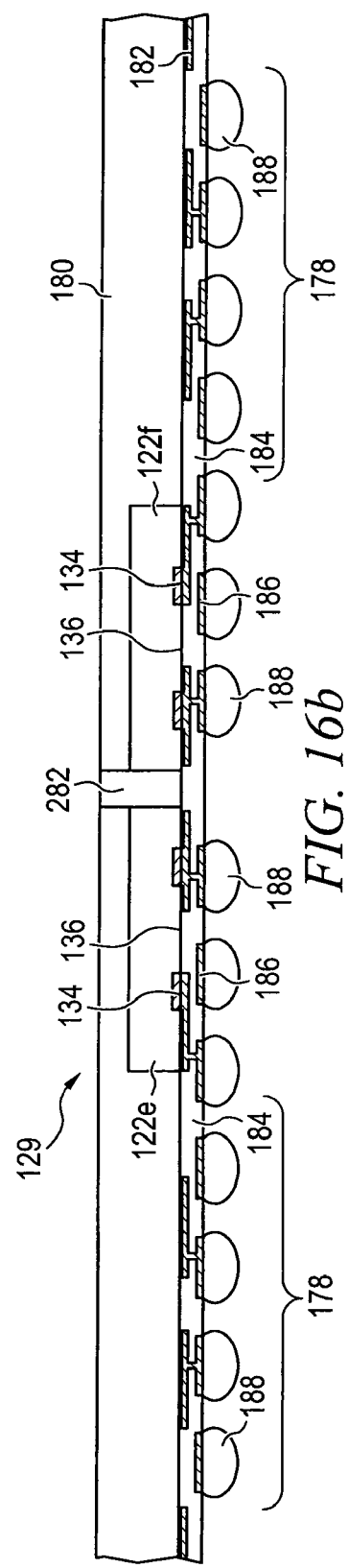
Figure 16C:
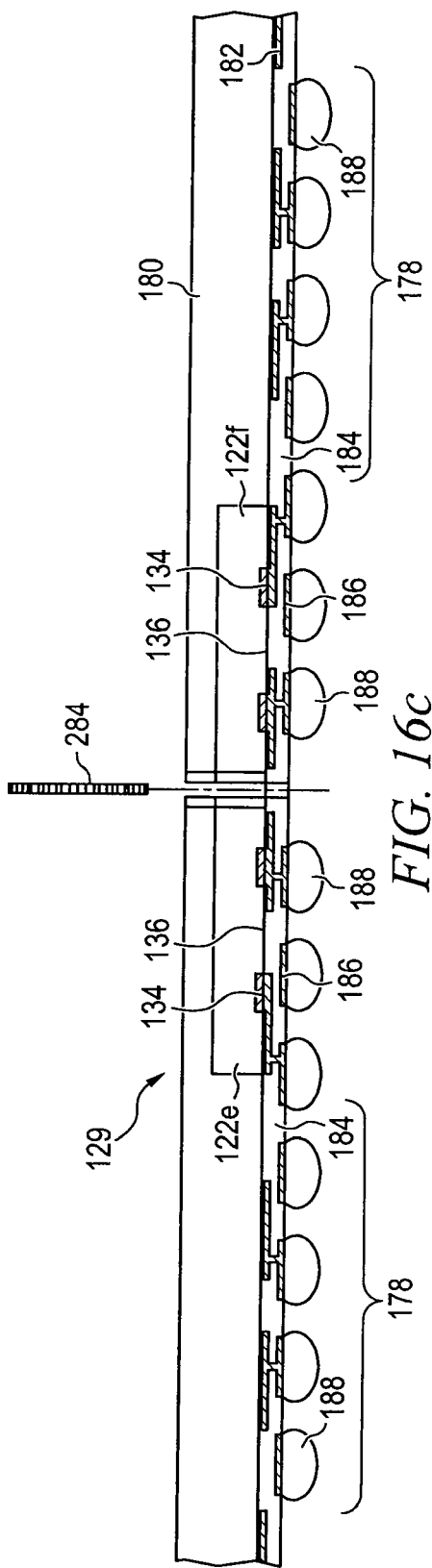
Figure 16D:
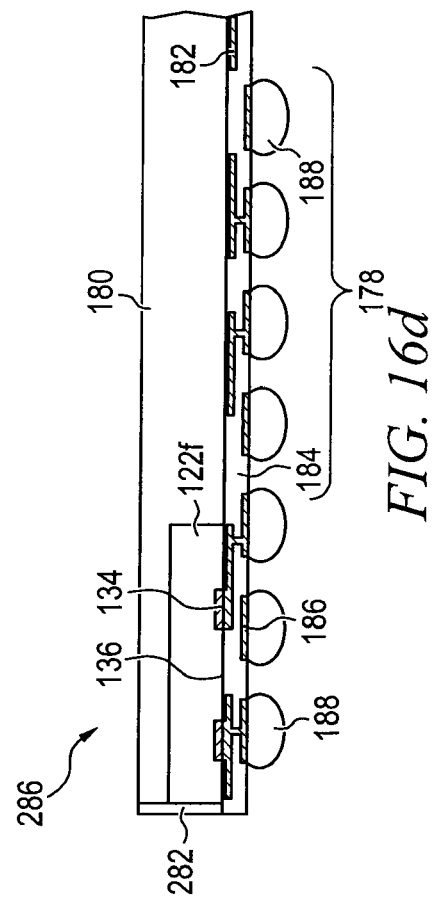

In another embodiment, and continuing with the structure described in FIGS. 4a-4c, a via 280 is formed through saw street 124 using a saw blade or laser cutting device, as shown in FIG. 16a. In FIG. 16b, the via is filled with non-conductive protective material 282, such as epoxy resin with filler, epoxy acrylate with filler, polymer with proper filler, polyimide, benzocyclobutene (BCB), polybenzoxazoles (PBO), polynorbornene, or other polymer material, using needle dispensing or spraying. In FIG. 16c, the two-die groups 129 are singulated into individual semiconductor devices with saw blade or laser cutting device 284 through saw street 124 between semiconductor die 122e and 122f. The protective material 282 covers the sides of semiconductor die 122e and 122f following singulation. FIG. 16d shows FO-WLCSP 286 after singulation. Semiconductor die 122e and 122f are electrically connected to build-up interconnect structure 182 and bumps 188. The arrangement of the four-die groups 129 on carrier 130 according to FIG. 5h provides an extension of interconnect structure 182 in area 178 for additional interconnectivity.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
providing a semiconductor wafer containing a plurality of semiconductor die separated by a plurality of saw streets;
singulating the semiconductor wafer through a portion of the saw streets to form a plurality of separate wafer sections each including multiple semiconductor die attached by uncut saw streets;
disposing the wafer sections in a grid pattern with each wafer section separate from an adjacent wafer section to provide an interconnect area between the wafer sections;
depositing an encapsulant between the wafer sections in the interconnect area;
forming a first interconnect structure over the wafer sections and encapsulant in the interconnect area; and
singulating the wafer sections and interconnect area to separate the semiconductor die each with a portion of the first interconnect structure and an exposed side surface of the semiconductor die.

2. The method of claim 1, wherein each wafer section includes at least four semiconductor die.

3. The method of claim 1, wherein one of the wafer sections contains four semiconductor die.

4. The method of claim 1, further including forming a heat sink over the wafer sections.

5. The method of claim 1, further including forming a shielding layer over the wafer sections.

6. The method of claim 1, further including forming a vertical conductive interconnect through the encapsulant in the interconnect area.

7. The method of claim 1, further including stacking the wafer sections.

8. The method of claim 1, further including disposing a discrete semiconductor component over the first interconnect structure in the interconnect area.

9. The method of claim 1, further including forming a second interconnect structure over a surface of the wafer sections and encapsulant to connect with the first interconnect structure.

10. A method of making a semiconductor device, comprising:
providing a semiconductor wafer containing a plurality of semiconductor die;
singulating the semiconductor wafer to form a plurality of separate wafer sections each including multiple semiconductor die;
disposing the wafer sections separated in a grid pattern to include an interconnect area between the wafer sections;
depositing an encapsulant over the wafer sections and interconnect area;
forming an interconnect structure over the wafer sections and encapsulant in the interconnect area; and
singulating the wafer sections and interconnect area to separate the semiconductor die each with a portion of the interconnect structure.

11. The method of claim 10, further including singulating the semiconductor wafer through a portion of saw streets separating the semiconductor die to form the wafer sections each including multiple semiconductor die per wafer section attached by uncut saw streets.

12. The method of claim 10, wherein each wafer section includes at least four semiconductor die.

13. The method of claim 10, further including forming a heat sink over the wafer sections.

14. The method of claim 10, further including forming a shielding layer over the wafer sections.

15. The method of claim 10, further including forming a vertical conductive interconnect through encapsulant in the interconnect area.

16. The method of claim 10, further including depositing a protective layer on a side of the semiconductor die.

17. The method of claim 10, wherein a first wafer section includes a first size semiconductor die and a second wafer section includes a second size semiconductor die, the first size semiconductor die being different from the second size semiconductor die.

18. A method of making a semiconductor device, comprising:
singulating a semiconductor wafer to form a plurality of separate wafer sections each including multiple semiconductor die attached by uncut saw streets;
depositing an encapsulant between the wafer sections;

forming a first interconnect structure over the wafer sections and the encapsulant between the wafer sections; and singulating the wafer sections to separate the semiconductor die each with a portion of the first interconnect structure.

19. The method of claim 18 further including disposing the wafer sections in a grid pattern to reserve an interconnect area between the wafer sections.

20. The method of claim 18, wherein each wafer section includes at least four semiconductor die.

21. The method of claim 18, further including forming a heat sink over the wafer sections.

22. The method of claim 18, further including forming a shielding layer over the wafer sections.

23. The method of claim 19, further including forming a conductive pillar in the encapsulant in the interconnect area.

24. The method of claim 19, further including disposing a discrete semiconductor component over the first interconnect structure in the interconnect area.

25. The method of claim 18, further including forming a second interconnect structure over a surface of the wafer sections and encapsulant opposite the first interconnect structure.

26. A method of making a semiconductor device, comprising:

singulating a semiconductor wafer to form a plurality of separate wafer sections including multiple semiconductor die per wafer section; and disposing the wafer sections separated in a grid pattern to include an interconnect area between the wafer sections.

27. The method of claim 26, further including:

depositing an encapsulant over the wafer sections and interconnect area; and forming an interconnect structure over the wafer sections and encapsulant in the interconnect area.

28. The method of claim 27, further including singulating the wafer sections and interconnect area to separate the semiconductor die each with a portion of the interconnect structure.

29. The method of claim 26, wherein each wafer section includes at least four semiconductor die.

* * * * *